(12) United States Patent
Kim et al.

(10) Patent No.: US 7,459,388 B2
(45) Date of Patent: Dec. 2, 2008

(54) METHODS OF FORMING DUAL-DAMASCENE INTERCONNECT STRUCTURES USING ADHESION LAYERS HAVING HIGH INTERNAL COMPRESSIVE STRESSES

(75) Inventors: Jaehak Kim, Fishkill, NY (US); Darryl D. Restaino, Modena, NY (US); Johnny Widodo, Beacon, NY (US)

(73) Assignees: Samsung Electronics Co., Ltd. (KR); Chartered Semiconductor Manufacturing, Ltd., Singapore (SG); International Business Machines Corporation, Armonk, NY (US)

( * ) Notice: Subject to any disclaimer, the term of this patent is extended or adjusted under 35 U.S.C. 154(b) by 62 days.

(21) Appl. No.: 11/470,320

(22) Filed: Sep. 6, 2006

(65) Prior Publication Data

US 2008/0057697 A1    Mar. 6, 2008

(51) Int. Cl.
*H01L 21/4763* (2006.01)

(52) U.S. Cl. .................. 438/618; 438/513; 438/637; 438/672; 257/E21.59; 257/E21.277; 257/E21.278; 257/E21.311; 257/E21.509

(58) Field of Classification Search .......... 438/618, 438/513, 637, 672, 673, 687, 723, 743, 756
See application file for complete search history.

(56) References Cited

U.S. PATENT DOCUMENTS

| | | | |
|---|---|---|---|
| 6,072,227 A | 6/2000 | Yau et al. | |
| 6,191,484 B1 | 2/2001 | Huang et al. | |
| 6,424,021 B1 | 7/2002 | Liu et al. | |
| 6,440,878 B1 | 8/2002 | Yang et al. | |
| 6,570,256 B2 | 5/2003 | Conti et al. | |
| 6,740,539 B2 | 5/2004 | Conti et al. | |
| 6,887,783 B2 | 5/2005 | Chen et al. | |
| 6,939,797 B2 | 9/2005 | Barth et al. | |
| 6,991,959 B2 * | 1/2006 | Goundar et al. | ............. 438/105 |
| 7,067,437 B2 | 6/2006 | Edelstein et al. | |
| 7,102,232 B2 | 9/2006 | Clevenger et al. | |
| 7,138,332 B2 * | 11/2006 | Goundar | ..................... 438/624 |
| 2004/0155342 A1 | 8/2004 | Usami et al. | |
| 2005/0230831 A1 | 10/2005 | Clevenger et al. | |

FOREIGN PATENT DOCUMENTS

| | | |
|---|---|---|
| JP | 2001-135592 | 5/2001 |
| JP | 2002-009152 | 1/2002 |

(Continued)

*Primary Examiner*—David Nhu
(74) *Attorney, Agent, or Firm*—Myers Bigel Sibley & Sajovec PA

(57) ABSTRACT

Methods of forming interconnect structures include forming a first metal wiring pattern on a first dielectric layer and forming a capping layer (e.g., SiCN layer) on the first copper wiring pattern. An adhesion layer is deposited on the capping layer, using a first source gas containing octamethylcyclotetrasilane (OMCTS) at a volumetric flow rate in a range from about 500 sccm to about 700 sccm and a second gas containing helium at a volumetric flow rate in a range from about 1000 to about 3000 sccm. The goal of the deposition step is to achieve an adhesion layer having an internal compressive stress of greater than about 150 MPa therein, so that the adhesion layer is less susceptible to etching/cleaning damage and moisture absorption during back-end processing steps. Additional dielectric and metal layers are then deposited on the adhesion layer.

19 Claims, 2 Drawing Sheets

FOREIGN PATENT DOCUMENTS

| | | |
|---|---|---|
| JP | 2004-241464 | 8/2004 |
| KR | 1998-033871 | 8/1998 |
| KR | 1020020027038 A | 4/2002 |
| KR | 1020020039837 | 5/2002 |
| KR | 1020040071631 A | 8/2004 |

* cited by examiner

METHODS OF FORMING DUAL-DAMASCENE INTERCONNECT STRUCTURES USING ADHESION LAYERS HAVING HIGH INTERNAL COMPRESSIVE STRESSES

FIELD OF THE INVENTION

The present invention relates to integrated circuit fabrication methods and, more particularly, to methods of fabricating integrated circuit devices having metal interconnect structures therein.

BACKGROUND OF THE INVENTION

Conventional methods of forming integrated circuit devices may include steps to form single and/or dual damascene structures using copper (Cu) as an electrical interconnect material. As illustrated by FIG. 1, a conventional dual-damascene copper wiring interconnect structure may be formed by patterning a first copper wiring pattern 12 within a first dielectric layer 10, which is disposed on a semiconductor substrate (not shown). This first dielectric layer 10 may be formed as a porous SiCOH layer having a relatively low dielectric constant, which supports low capacitive coupling between adjacent conductive layers and patterns (not shown). This first copper wiring pattern 12 may be covered by an electrically insulating capping layer 14, which may be formed as a SiCN layer. An adhesion layer 16 is also formed on the capping layer 14. This adhesion layer 16, which may also be referred to as a graded layer, is typically formed of a material having a strong adhesion strength, a low susceptibility to arching and undercutting (during processing) and a strong resistance to moisture absorption. An inter-metal dielectric (IMD) layer 18 is formed on the adhesion layer 16, as illustrated. This IMD layer 18 may also be formed of a material having a relatively low dielectric constant. This IMD layer 18 may then be patterned (once or multiple times) to define an opening therein that exposes an upper surface of the first copper wiring pattern 12. Conventional techniques may then be used to fill the opening with a second copper wiring pattern, which includes a copper plug/via 20a and a patterned copper wiring layer 20b thereon.

As will be understood by those skilled in the art, via yield degradation (VYD) within interconnect structures may increase in response to copper void formation within the copper plug/via 20a. These voids, which may form during processing, may be a byproduct of undercutting 22 of the adhesion layer 16 at an interface between a sidewall of the adhesion layer 16 and the copper plug/via 20a. According to additional theories, the occurrence of VYD may be related to an outgassing of moisture from the adhesion layer 16 during back-end processing steps.

SUMMARY OF THE INVENTION

Embodiments of the present invention include methods of forming an electrically insulating adhesion layer having reduced susceptibility to undercutting and moisture absorption during semiconductor processing. This adhesion layer is formed to have an internal compressive stress of greater than about 100 MPa and, more preferably, greater than about 150 MPa to thereby have sufficient ability to block etch-induced undercutting and moisture absorption. In particular, methods of forming electrical interconnect structures on semiconductor substrates including forming a first wiring pattern on a semiconductor substrate and then forming an electrically insulating adhesion layer on the first wiring pattern. The electrically insulating adhesion layer is formed to have an internal compressive stress of greater than about 100 MPa to thereby reduce its susceptibility to etching-induced undercutting and/or moisture absorption. An opening is then formed in the adhesion layer and the first wiring pattern is exposed by the opening. This opening may be formed using a selective etching step that exposes sidewalls of the adhesion layer to a chemical etchant and/or cleaning solutions.

Additional embodiments of the present invention include methods of forming dual-damascene copper wiring patterns by forming a first copper wiring pattern on a semiconductor substrate and then covering the first copper wiring pattern with an electrically insulating capping layer. An electrically insulating adhesion layer having an internal compressive stress of greater than about 100 MPa and, more preferably, greater than about 150 MPa, is formed on the capping layer. An inter-metal dielectric (IMD) layer is formed on the adhesion layer. This IMD layer is then selectively etched to define an opening therein. This opening extends through the IMD layer, the adhesion layer and the capping layer and exposes an upper surface of the first copper wiring pattern. The opening is the filled with a second copper wiring pattern.

Still further embodiments of the present invention include methods of forming a dual-damascene copper wiring pattern by forming a first copper wiring pattern on a semiconductor substrate and forming an electrically insulating capping layer (e.g., SiCN layer) on the first copper wiring pattern. An electrically insulating adhesion layer having an internal compressive stress of greater than about 150 MPa is formed on the capping layer and an inter-metal dielectric layer is formed on the adhesion layer. An opening is then formed that extends through the inter-metal dielectric layer, the adhesion layer and the capping layer and exposes the first copper wiring pattern. A second copper wiring pattern is then formed in the opening and electrically contacts the first copper wiring pattern. According to these embodiments, the step of forming an electrically insulating adhesion layer includes depositing a silicon dioxide adhesion layer on the capping layer using source gases containing octamethylcyclotetrasilane (OMCTS) and helium (He).

An additional embodiment of the invention includes methods of forming a dual-damascene copper wiring patterns by forming a first dielectric layer comprising SiCOH on a semiconductor substrate and forming a first copper wiring pattern on the first dielectric layer. An electrically insulating capping layer comprising SiCN is formed on the first copper wiring pattern and then a silicon dioxide adhesion layer is deposited on the capping layer. This deposition step is performed using a first source gas containing octamethylcyclotetrasilane (OMCTS) at a volumetric flow rate in a range from about 500 sccm to about 700 sccm and a second gas containing helium at a volumetric flow rate in a range from about 1000 to about 3000 sccm. In some cases, an additional third source gas such as oxygen may be provided at a volumetric flow rate of about 160 sccm. A second dielectric layer is formed on the adhesion layer and then an opening is formed that extends through the second dielectric layer, the adhesion layer and the capping layer and exposes the first copper wiring pattern. This opening is filled with a second copper wiring pattern.

DETAILED DESCRIPTION OF PREFERRED EMBODIMENTS

Figure 1:
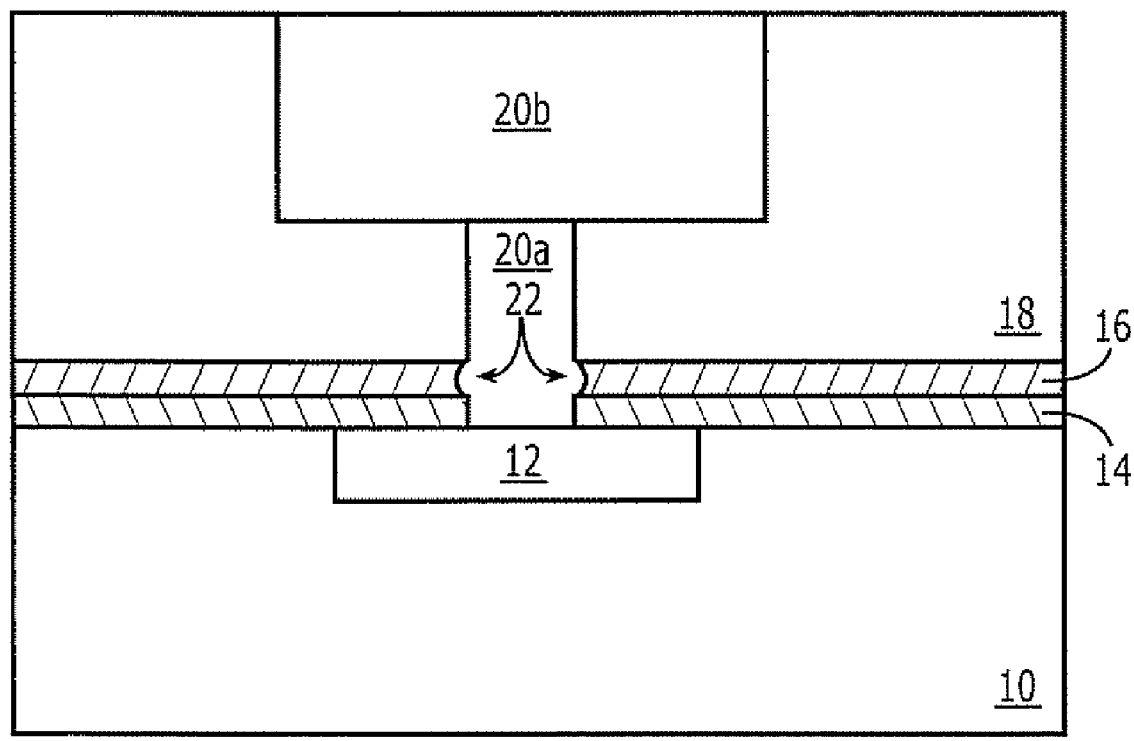
FIG. 1 is a cross-sectional illustration of a conventional dual-damascene copper interconnect structure.

The present invention will now be described more fully hereinafter with reference to the accompanying drawings, in which preferred embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. It will also be understood that when a layer is referred to as being "on" another layer or substrate, it can be directly on the other layer or substrate, or intervening layers may also be present. Like numbers refer to like elements throughout.

Figure 2A:
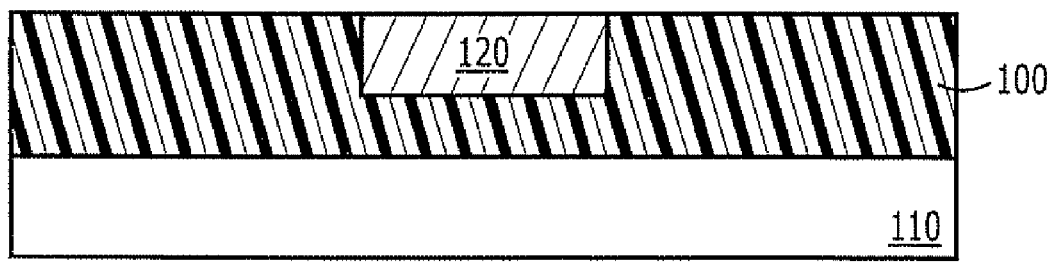
FIGS. 2A-2C are cross-sectional views of intermediate structures that illustrate methods of forming interconnect structures according to embodiments of the present invention.
Figure 2B:
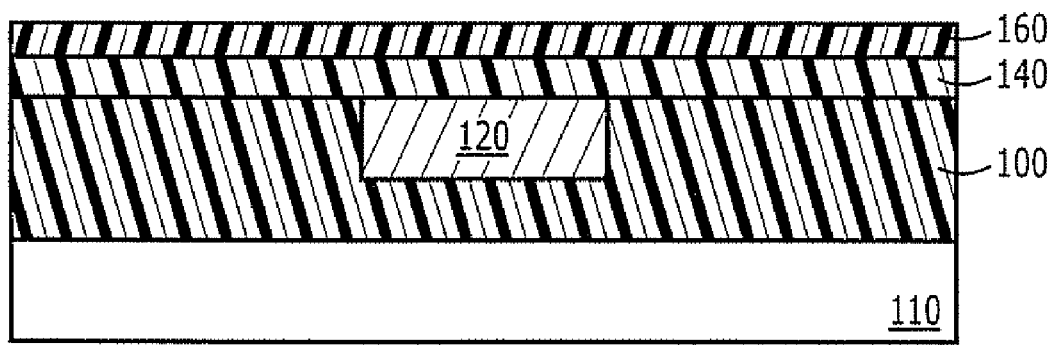
Figure 2C:
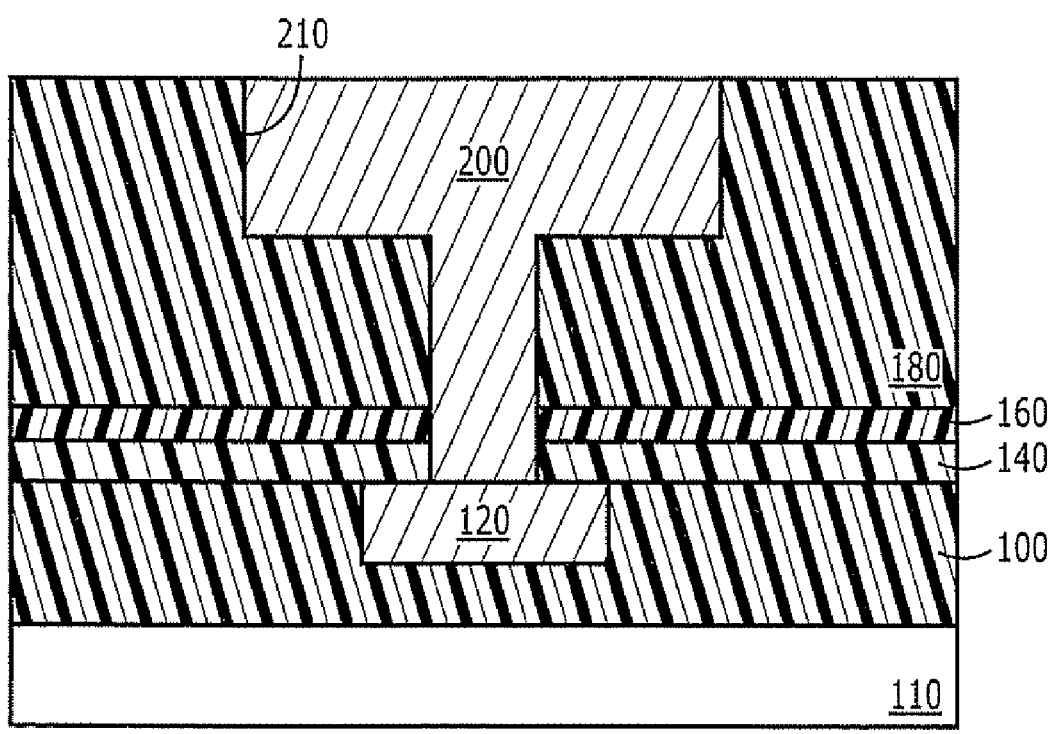

Embodiments of the present invention include methods of forming an electrical interconnect structure having an adhesion layer therein, which has a reduced susceptibility to undercutting and moisture absorption during semiconductor processing. This adhesion layer is formed to have an internal compressive stress of greater than about 100 MPa and, more preferably, greater than about 150 MPa, to thereby have sufficient ability to block etch-induced or cleaning-induced undercutting and moisture absorption. In particular, FIGS. 2A-2C illustrate methods of forming a dual-damascene copper wiring pattern by forming a first dielectric layer 100 on a semiconductor substrate 110. This first dielectric layer 100 may be a relatively low-k dielectric layer such as a SiCOH layer having a thickness in a range from about 1,000 Å to about 8,000 Å. A first copper wiring pattern 120 is formed on the first dielectric layer 100, as illustrated by FIG. 2A. This first copper wiring pattern 120 may be formed by patterning the first dielectric layer 100 to define a recess therein and then depositing a layer of copper metallization (not shown) into the recess. This layer of copper metallization may then be planarized for a sufficient duration to expose an upper surface of the first dielectric layer 100 and define a shape of the first copper wiring pattern 120.

Thereafter, as illustrated by FIG. 2B, an electrically insulating capping layer 140 and a silicon dioxide adhesion layer 160 are formed on the first dielectric layer 100 and the first copper wiring pattern 120. In some embodiments of the invention, the capping layer may be a SiCN layer having a thickness in a range from about 100 Å to about 1,000 Å. This silicon dioxide adhesion layer 160 is formed by depositing silicon dioxide on the capping layer 140, using a combination of at least a first source gas containing octamethylcyclotetrasilane (OMCTS) and a second source gas containing helium in a deposition chamber. This deposition step may be performed at a pressure of about 5 torr and a temperature of about 350° C., using OMCTS as a source gas at a flow rate of about 500 sccm, $O_2$ as a source gas at a flow rate of about 500 sccm and He as a source gas at a flow rate of about 1000 sccm.

In particular, in order to achieve a level of internal compressive stress within the adhesion layer 160 that exceeds 100 MPa and, more preferably, exceeds 150 MPa, the first source gas containing octamethylcyclotetrasilane (OMCTS) is provided at a volumetric flow rate in a range from about 500 sccm to about 700 sccm and the second gas containing helium is provided at a volumetric flow rate in a range from about 1000 to about 3000 sccm. A third source gas comprising oxygen ($O_2$) may also be provided in combination with the first and second source gases. This third source gas may be provided at a volumetric flow rate of about 160 sccm.

Referring now to FIG. 2C, a second dielectric layer 180 is formed on the adhesion layer 160. This second dielectric layer 180, which may be formed using one or more separate deposition steps, may be a relatively low-k dielectric layer such as a SiCOH layer having a thickness in a range from about 1,000 Å to about 10,000 Å. An opening 210 is provided in the second dielectric layer 180 using one or more photolithographically defined etching steps. As illustrated, this opening 210 extends through the second dielectric layer 180, the adhesion layer 160 and the capping layer 140 and exposes an upper surface of the first copper wiring pattern 120. This opening 210 may then be cleaned using a diluted hydrofluoric acid (DHF) solution, which is exposed to sidewalls of the adhesion layer 160 having relatively high internal compressive stress. The opening 210 is then filled with a second copper wiring pattern 200, as illustrated. This second copper wiring pattern 200 may be formed from a combination of separately deposited (and patterned) copper layers using conventional damascene processing techniques.

Accordingly, embodiments of the present invention illustrated and described herein result in the fabrication of an electrical interconnect structure that includes a first metal wiring pattern on a semiconductor substrate and an electrically insulating adhesion layer having an internal compressive stress of greater than about 150 MPa, on the first metal wiring pattern. A second metal wiring pattern is also provided that extends through an opening in the electrically insulating adhesion layer and directly contacting the first metal wiring pattern. The interconnect structure further includes a low-k dielectric layer (e.g., SiCOH layer) extending on the electrically insulating adhesion layer. This low-k dielectric layer has an opening therein that is aligned with the opening in the electrically insulating adhesion layer.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. A method of forming an electrically conductive interconnect structure, comprising the steps of:
    forming a first electrically conductive structure on a semiconductor substrate;
    forming an electrically insulating adhesion layer having an internal compressive stress of greater than about 150 MPa, on the first electrically conductive structure;
    selectively etching the electrically insulating adhesion layer to define an opening therein that exposes the first electrically conductive structure; and
    filling the opening with a second electrically conductive structure.

2. The method of claim 1, wherein said step of forming an electrically insulating adhesion layer comprises depositing a silicon dioxide adhesion layer on the first electrically conductive structure using source gases containing octamethylcyclotetrasilane (OMCTS) and helium (He).

3. The method of claim 1, wherein said step of forming an electrically insulating adhesion layer comprises depositing a silicon dioxide adhesion layer using source gases containing octamethylcyclotetrasilane (OMOTS), oxygen (O2) and an inert carrier gas.

4. The method of claim 1, wherein said step of filling the opening is preceded by a step of exposing a sidewall of the electrically insulating adhesion layer to a diluted hydrofluoric acid solution.

5. The method of claim 1, wherein said step of forming a first electrically conductive structure is preceded by the steps of forming a SiCOH dielectric layer having a recess therein, on the semiconductor substrate; and wherein said step of forming a first electrically conductive structure comprises forming a filling the recess with a copper layer and planarizing the copper layer to define a copper wiring pattern within the recess.

6. The method of claim 5, wherein said step of forming an electrically insulating adhesion layer is preceded by a step of forming an electrically insulating capping layer comprising SiCN directly on an upper surface of the copper wiring pattern.

7. The method of claim 6, wherein said step of forming an electrically insulating adhesion layer comprises forming an electrically insulating adhesion layer directly on an upper surface of the electrically insulating capping layer.

8. The method of claim 2, wherein said step of forming a first electrically conductive structure is preceded by the steps of forming a SiCOH dielectric layer having a recess therein, on the semiconductor substrate; and wherein said step of forming a first electrically conductive structure comprises forming a filling the recess with a copper layer and planarizing the copper layer to define a copper wiring pattern within the recess.

9. The method of claim 8, wherein said step of forming an electrically insulating adhesion layer is preceded by a step of forming an electrically insulating capping layer comprising SiCN directly on an upper surface of the copper wiring pattern.

10. The method of claim 9, wherein said step of forming an electrically insulating adhesion layer comprises forming an electrically insulating adhesion layer directly on an upper surface of the electrically insulating capping layer.

11. A method of forming a dual-damascene copper wiring pattern, comprising the steps of:
    forming a first copper wiring pattern on a semiconductor substrate;
    forming an electrically insulating capping layer on the first copper wiring pattern;
    forming an electrically insulating adhesion layer having an internal compressive stress of greater than about 100 MPa, on the electrically insulating capping layer, by depositing a silicon dioxide adhesion layer using source gases containing octamethylcyclotetrasilane (OMCTS) and helium (He);
    forming an inter-metal dielectric layer on the electrically insulating adhesion layer;
    forming an opening that extends through the inter-metal dielectric layer, the electrically insulating adhesion layer and the electrically insulating capping layer and exposes the first copper wiring pattern; and
    forming a second copper wiring pattern in the opening.

12. The method of claim 11, wherein the silicon dioxide adhesion layer has an internal compressive stress of greater than about 150 MPa.

13. The method of claim 11, wherein said step of forming a second copper wiring pattern is preceded by a step of exposing the electrically insulating adhesion layer to a diluted hydrofluoric acid solution.

14. The method of claim 11, wherein the electrically insulating capping layer comprises SiCN.

15. The method of claim 11, wherein the inter-metal dielectric layer comprises SiCOH.

16. A method of forming a dual-damascene copper wiring pattern, comprising the steps of:
    forming a first dielectric layer comprising SIOCH on a semiconductor substrate;
    forming a first copper wiring pattern on the first dielectric layer;
    forming an electrically insulating capping layer comprising SiCN on the first copper wiring pattern;
    depositing a silicon dioxide adhesion layer on the electrically insulating capping layer, using a first source gas containing octamethylcyclotetrasilane (OMCTS) at a volumetric flow rate in a range from about 500 sccm to about 700sccm and a second source gas containing helium at a volumetric flow rate in a range from about 1000 sccm to about 3000 sccm;
    forming a second dielectric layer comprising SiCOH on the silicon dioxide adhesion layer;
    forming an opening that extends through the second dielectric layer, the silicon dioxide adhesion layer and the electrically insulating capping layer and exposes the first copper wiring pattern; and
    forming a second copper wiring pattern in the opening.

17. The method of claim 16, wherein said depositing step comprises depositing the silicon dioxide adhesion layer using a third source gas comprising oxygen ($O_2$) at a volumetric flow rate of about 160 sccm.

18. The method of claim 16, wherein said depositing comprises depositing a silicon dioxide adhesion layer having an internal compressive stress of greater than about 150 MPa.

19. A method of forming an electrical interconnect structure, comprising the steps of:
    forming a dielectric layer on a semiconductor substrate;
    forming a metal wiring pattern on the dielectric layer; and
    depositing an adhesion layer on the metal wiring pattern using a first source gas containing octamethylcyclotetrasilane (OMCTS) at a volumetric flow rate in a range from about 500 sccm to about 700 sccm and a second gas containing helium at a volumetric flow rate in a range from about 1000 sccm to about 3000 sccm.

* * * * *

UNITED STATES PATENT AND TRADEMARK OFFICE
CERTIFICATE OF CORRECTION

PATENT NO.       : 7,459,388 B2                                    Page 1 of 1
APPLICATION NO.  : 11/470320
DATED            : December 2, 2008
INVENTOR(S)      : Kim et al.

It is certified that error appears in the above-identified patent and that said Letters Patent is hereby corrected as shown below:

Column 4, Claim 3, Line 66: Please correct "(OMOTS)"
                            To read -- (OMCTS) --

Column 6, Claim 16, Line 17: Please correct "SIOCH"
                             To read -- SiCOH --

Signed and Sealed this

Tenth Day of February, 2009

JOHN DOLL
*Acting Director of the United States Patent and Trademark Office*